United States Patent
McHann, Jr. et al.

(10) Patent No.: US 8,428,201 B1
(45) Date of Patent: Apr. 23, 2013

(54) RECEIVER GAIN ADJUSTMENT

(75) Inventors: Stanley E. McHann, Jr., Crosslake, MN (US); Jim Amweg, Baxter, MN (US)

(73) Assignee: Landis+Gyr Technologies, LLC, Pequot Lakes, MN (US)

( * ) Notice: Subject to any disclaimer, the term of this patent is extended or adjusted under 35 U.S.C. 154(b) by 520 days.

(21) Appl. No.: 12/715,508

(22) Filed: Mar. 2, 2010

(51) Int. Cl.
 *H04L 27/08* (2006.01)
(52) U.S. Cl.
 USPC ........... 375/345; 375/257; 375/285; 375/316; 455/127.2; 455/219; 455/232.1; 455/234.1
(58) Field of Classification Search .................. 375/257, 375/285, 316, 345; 455/127.2, 219, 232.1, 455/234.1
See application file for complete search history.

(56) References Cited

U.S. PATENT DOCUMENTS

| | | | |
|---|---|---|---|
| 2003/0007570 A1* | 1/2003 | Kim et al. | 375/303 |
| 2004/0104771 A1* | 6/2004 | Dauphinee et al. | 330/129 |

\* cited by examiner

*Primary Examiner* — Leon Flores
(74) *Attorney, Agent, or Firm* — Crawford Maunu PLLC

(57) ABSTRACT

Methods, systems, and apparatus, including computer programs encoded on a computer storage medium, for selecting receiver gain adjustment values. In one aspect, a method includes receiving aggregate signal characteristic values ("aggregate values") for a plurality of signals being received over active channels of a power line communications network, the aggregate values being computed based on signal characteristic values for each of the signals being received over the active channels. Using the aggregate values, a determination is made that one or more of the aggregate values have been outside of a valid range of signal characteristic values over a specified period. In response to determining that the aggregate values have been outside of the valid range, a receiver gain adjustment value is selected based on the aggregate values and a receiver gain of a receiver that receives the signals is adjusted.

22 Claims, 5 Drawing Sheets

RECEIVER GAIN ADJUSTMENT

BACKGROUND

This specification relates to adjusting receiver characteristics.

Service providers utilize distributed networks to provide services to customers over large geographic areas. For example, communications companies utilize a distributed communications network to provide communications services to customers. Similarly, power companies utilize a network of power lines and meters to provide power to customers throughout a geographic region and receive data back about the power usage.

These service providers are dependent on proper operation of their respective networks to deliver services to the customers and receive data back from customers' meters. For example, the service provider may want access to daily usage reports to efficiently bill their customers. Therefore, when a network outage or other network event occurs that disrupts data communication over the network, it is in the best interest of the service provider to identify the cause of the problem and correct the problem as soon as possible so that data continues to be logged.

In many distributed networks, service providers first receive an indication that there is a problem with the network based on feedback from customers or inability to log data received over the network. For example, customers may call the service provider to report a network outage or the service provider may receive a notification that data from a set of meters is not being reliably logged.

While a service provider can remedy network problems in response to notification that data is not being logged correctly, for example, by manually adjusting network components to remedy a problem, the time and resources required to identify the cause of the problem and correct it can result in significant loss of data. Thus, if a service provider can prevent the problem before it occurs, the service provider can reduce the amount of data lost.

SUMMARY

In general, one innovative aspect of the subject matter described in this specification can be embodied in methods that include the actions of receiving, by a data processing apparatus, aggregate signal characteristic values for a plurality of signals being received over active channels of a power line communications network, the aggregate signal characteristic values being computed based on measured signal characteristic values for each of the signals being received over the active channels, the active communications channels being communications channels that have been assigned to communications nodes; determining, by the data processing apparatus, that one or more of the aggregate signal characteristic values have been outside of a valid range of signal characteristic values over a specified period, the valid range of signal characteristic values specifying at least a high characteristic threshold and a low characteristic threshold; in response to determining that the aggregate signal characteristic values have been outside of the valid range, selecting, by the data processing apparatus, a receiver gain adjustment value based on the aggregate signal characteristic values; and adjusting, by the data processing apparatus, a receiver gain of a receiver that receives the signals over the power line communications network based on the receiver gain adjustment value. Other embodiments of this aspect include corresponding systems, apparatus, and computer programs, configured to perform the actions of the methods, encoded on computer storage devices.

These and other embodiments can each optionally include one or more of the following features. Selecting the receiver gain adjustment value can include the actions of selecting an initial receiver gain adjustment value based on an aggregate high amplitude for the signals violating a high amplitude threshold; determining that an aggregate mean amplitude violates a high mean threshold for the signals that specifies a highest acceptable aggregate mean amplitude for the signals; determining that the aggregate high amplitude for the signals has decreased over a specified time; determining that signal to noise ratios for the signals have decreased over the specified time; and in response to determining that the aggregate mean amplitude violates a high mean threshold, determining that the aggregate high amplitude for the signals has decreased, and determining that signal to noise ratios for the signals have decreased, selecting a final receiver gain adjustment value that is higher than the initial receiver gain adjustment value based on an amount by which the aggregate high amplitude and the signal to noise ratio have decreased over the specified time.

Determining that signal amplitude values of the signals have decreased can include the actions of computing an aggregate mean amplitude for active channels, each active channel being a channel over which a node in the network is communicating; and determining that the aggregate mean amplitude for the active channels is lower than at least one previously computed aggregate mean amplitude for the active channels.

Selecting the receiver gain adjustment value can include the actions of selecting an initial receiver gain adjustment value based on an aggregate high amplitude for the signals violating a high amplitude threshold; determining that an aggregate amplitude swing violates an amplitude swing threshold, the amplitude swing threshold specifying a minimum acceptable amplitude swing for signals received over active channels; determining that at least one of the aggregate high amplitude and a signal to noise ratio for the signals has decreased over a specified time; and selecting a final receiver gain adjustment value that is higher than the initial receiver gain adjustment value.

Determining that at least one of the aggregate high amplitude and the signal to noise ratio has decreased over time can include the actions of computing an aggregate high amplitude for the active channels, each active channel being a channel over which valid data is being received; and determining that the aggregate high amplitude for the active channels is lower than at least one previously computed, has decreased over time and is lower than at least one previously computed aggregate high amplitude for the active channels.

Methods can further include the actions of initializing aggregate signal characteristic values of a signal characteristic log to default values; and storing aggregate signal characteristic values in the characteristic log, the stored values including an aggregate high amplitude and an aggregate low amplitude.

Determining that one or more of the aggregate signal characteristic values have been outside of a valid range of signal characteristic values can include determining that an aggregate high amplitude for the signals has been higher than a high amplitude threshold. Selecting a receiver gain adjustment value based on the aggregate signal characteristics can include selecting an initial receiver gain adjustment value based on a magnitude by which the aggregate high amplitude exceeds the high amplitude threshold. A final receiver gain adjustment value that is higher than the initial receiver gain adjustment value when the aggregate high amplitude or a signal to noise ratio for the signals has decreased over a specified time can be selected.

Determining that one or more of the aggregate signal characteristic values have been outside of a valid range of signal characteristic values can include determining that an aggregate low amplitude for the signals has been lower than a low amplitude threshold. Selecting a receiver gain adjustment value based on the aggregate signal characteristics can include selecting an initial receiver gain adjustment value based on a magnitude by which the aggregate low amplitude is less than the low amplitude threshold.

Methods can further include the actions of determining that an aggregate mean value for the signals violates a low mean threshold representing a lowest acceptable aggregate mean value for signals received over active channels, the active channels being channels over which nodes in the network are transmitting data; determining that the aggregate low amplitude or an aggregate signal to noise ratio for the signals have decreased over time; and in response to determining that an aggregate mean value for the signals violates a low mean threshold and determining that the aggregate low amplitude or an aggregate signal to noise ratio for the signals have decreased over time, selecting a final receiver gain adjustment value that is lower than the initial receiver gain adjustment value.

Receiving aggregate signal characteristic values can include receiving a vector of values, where each value in the vector represents a signal characteristic value for a signal being received over a corresponding channel.

Particular embodiments of the subject matter described in this specification can be implemented so as to realize one or more of the following advantages. Receiver gains can be adjusted based on a magnitude by which signal characteristic values for a plurality of signals violate signal characteristic thresholds. Receiver gains can be adjusted based on signal characteristic value trend information to increase the likelihood that valid data continues to be logged over channels of a power line communications network. Receiver gains can be automatically adjusted by a processing apparatus based on the selected receiver gain adjustment value.

The details of one or more embodiments of the subject matter described in this specification are set forth in the accompanying drawings and the description below. Other features, aspects, and advantages of the subject matter will become apparent from the description, the drawings, and the claims.

BRIEF DESCRIPTION OF THE DRAWINGS

Like reference numbers and designations in the various drawings indicate like elements.

DETAILED DESCRIPTION

A receiver adjustment subsystem monitors signal characteristics of signals received over a power line communications network and, based on the signal characteristics, adjusts gain characteristics of a receiver that receives the signals. For example, the receiver adjustment subsystem can increase receiver gain to increase amplitudes of signals received over the channels when the signal characteristics are lower than specified thresholds and/or have decreased over time. Similarly, the receiver adjustment subsystem can decrease receiver gain to decrease the amplitudes of signals received over the channels when the signal characteristics are higher than specified thresholds and/or have increased over time.

The receiver adjustment subsystem and other systems, apparatus, and methods for adjusting receiver gain are described below with reference to a power line communications network. The receiver adjustment subsystem and other systems, apparatus, and methods described below can also be implemented in other network environments. Additionally, the receiver adjustment subsystem is described below as a subsystem of a substation processing unit. However, the receiver adjustment subsystem can also be implemented as an independent system that communicates directly, or over a network, with the substation processing unit.

Figure 1:
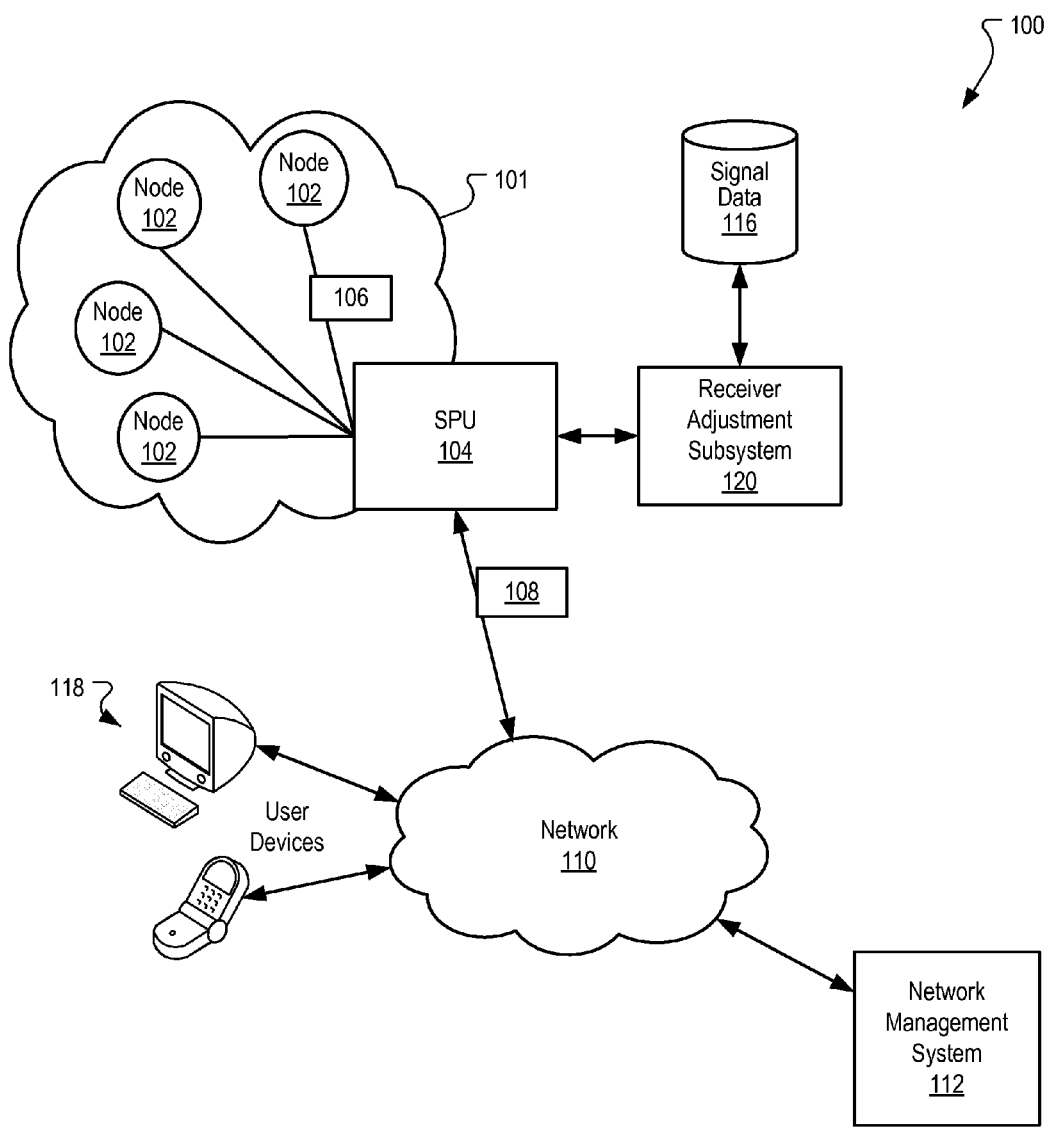
FIG. 1 is a block diagram of an example network environment in which receiver gain can be adjusted based on signal characteristics of received signals.

FIG. 1 is a block diagram of an example network environment 100 in which receiver gain can be adjusted based on signal characteristics of received signals. The network environment 100 includes a service network 101 in which a plurality of nodes 102 are coupled to a substation processing unit 104. The nodes 102 can be any device capable of transmitting information in the network environment 100. For example, the nodes 102 can be meters in a utility network, computing devices, television set top terminals or telephones that transmit data in the service network. The description that follows refers to the nodes 102 as meters in a power distribution network. However, the description is applicable to other types of communications nodes in other utility or general purpose networks.

The nodes 102 can be implemented to monitor and report various operating characteristics of the service network 101. For example, in a power distribution network, meters can monitor characteristics related to power usage in the network. Example characteristics related to power usage in the network include average or total power consumption, power surges, power drops and load changes among other characteristics.

The nodes 102 report the operating characteristics of the network over communications channels. Communications channels are portions of radio frequency spectrum over which data are transmitted. The frequency spectrum and bandwidth of each communications channel can depend on the communications system in which they are implemented. For example, communications channels for utility meters (e.g., power, gas and/or water meters) can be implemented in power line communication (PLC) systems and wireless communications systems such as cellular communications systems, wireless broadband networks, wireless mesh networks and other wireless communications systems.

Communications channels for each of these different communications systems have distinct operating parameters that are defined, in part, by communications standards and/or environmental considerations. For example, in a PLC system, operating parameters for communications channels can be defined so that the communications channels can operate on the same transmission lines on which power is distributed throughout a power grid.

In some implementations, the nodes 102 transmit the operating characteristics of the service network 101 over communications channels to a substation processing unit 104. The substation processing unit (SPU) 104 is a processing apparatus that receives communications from nodes 102 to manage services provided over the service network 101 or for transmission though a data network 110. For example, the SPU 104 can include a receiver that receives data bits or data packets 106 from the nodes 102 and log data received from the nodes 102. The SPU 104 can also take action based on the data received from the nodes 102 or transmit the data packets 106 to a network management system 112 that manages the network. The SPU 104 can transmit the individual data packets 106 or generate a consolidated packet 108 that includes data from multiple data packets 106 received from the nodes 102.

The data packets 106 that are received from the nodes 102 can include data representing various operating conditions corresponding to the node from which the data packet 106 was received as well as usage and billing information. For example, the data packets can include data reporting monthly, daily, or hourly electricity usage as measured by a power usage meter. Similarly, the data packets 106 can include data reporting a power outage or power restoration event. In some implementations, a single SPU 104 can be configured receive data packets 106 from thousands of nodes 102 and transmit the data packets 106 through a data network 110.

The data network 110 can be a wide area network (WAN), local area network (LAN), the Internet, or any other communications network. The data network 110 can be implemented as a wired or wireless network. Wired networks can include any media-constrained networks including, but not limited to, networks implemented using metallic wire conductors, fiber optic materials, or waveguides. Wireless networks include all free-space propagation networks including, but not limited to, networks implemented using radio wave and free-space optical networks. While only one SPU 104 is shown, the service network 101 can include many different SPUs 104.

In some implementations, the data network 110 couples the SPU 104 to the network management system 112. The network management system 112 is a system that monitors and/or controls the service network 101. The network management system 112 can control different characteristics of the service network 101 based on data received from nodes 102 that are installed in the service network 101.

For example, in a PLC network, the network management system 112 can receive data indicating that power usage is significantly higher in a particular portion of a power network than in other portions of the power network. Based on this data, the network management system 112 can allocate additional resources to that particular portion of the network (i.e., load balance) or provide status data specifying that there is increased power usage in the particular portion of the power network.

The network management system 112 can provide the status data to a user device 118 that can be accessed, for example, by the network operator, maintenance personnel and/or customers. For example, status data identifying the detected increased usage described above can be provided to a user device 118 accessible by the network operator, who can, in turn, determine an appropriate action regarding the increased usage. Similarly, if the status data indicates that there is a network outage, the network management system 112 can provide data to user devices 118 accessible by customers to provide information regarding the existence of the outage and potentially provide information estimating a duration of the outage.

Data packets 106 from a particular node 102 may be transmitted over one of thousands of channels in a PLC system. However, the ability to reliably receive data over the channels in the PLC system can be affected by significant network events that cause signal anomalies on the communications channels. For example, when a power outage occurs in a PLC network, amplitudes of communications signals that are transmitted on channels over which nodes affected by the power outage communicate can drop to substantially zero. Amplitudes of communications signals can be measured in units of voltage or power and are referred to throughout this document as signal amplitudes.

As characteristics of the service network change, the signal characteristics (e.g., signal amplitude and signal to noise ratios) of signals transmitted in the network also change. For example, when a capacitor bank is activated, the amplitudes of signals received at the SPU 104 can fall because the impedance of the capacitor bank can be lower than that of the SPU 104, and therefore, more current flows to the capacitor bank than the SPU 104. The signal characteristics of the signals can also vary over time, for example, in response to changes in the environment in which the service network 101 is located (e.g., increased noise from noise sources near components of the network).

As the signal characteristics of the signals change, it can be beneficial to adjust characteristics of receivers that receive the signals. For example, the SPU 104 may require that signals have at least a minimum peak to peak amplitude (e.g., a mathematical difference between a maximum amplitude for the signal and a minimum amplitude for the signal) to ensure accurate data recovery. Therefore, when the peak to peak amplitude of signals ("amplitude swings") being received at a receiver fall, the gain of the receiver can be increased to increase the peak to peak amplitudes of the signals. By increasing the peak to peak amplitudes for the signals being processed by the SPU 104, valid data can continue to be obtained from the signals even though the actual signal amplitudes have fallen. Similarly, when the amplitudes of the signals increase beyond a specified threshold, the gain of the receiver can be reduced so that the amplitudes of the signals remain in a valid range of signal amplitude values (e.g., to prevent clipping of the signals), as described in more detail with reference to FIG. 2.

The SPU 104 includes a receiver adjustment subsystem 120 that adjusts receiver characteristics based on measured signal characteristics of the individual signals (or subsets of all signals) received by the SPU 104. For example the receiver adjustment subsystem (RAS) 120 can increase the gain of a receiver when the measured signal characteristics for the individual signals being received by the SPU 104 are determined to violate a specified threshold (e.g., a minimum acceptable peak to peak amplitude threshold) and decrease the gain of the receiver when the signal characteristics of the signals violate another specified threshold (e.g., a maximum or minimum amplitude threshold). Adjusting receiver gain based on signal characteristics of signals received by a receiver is described in more detail with reference to FIG. 3.

Figure 2:
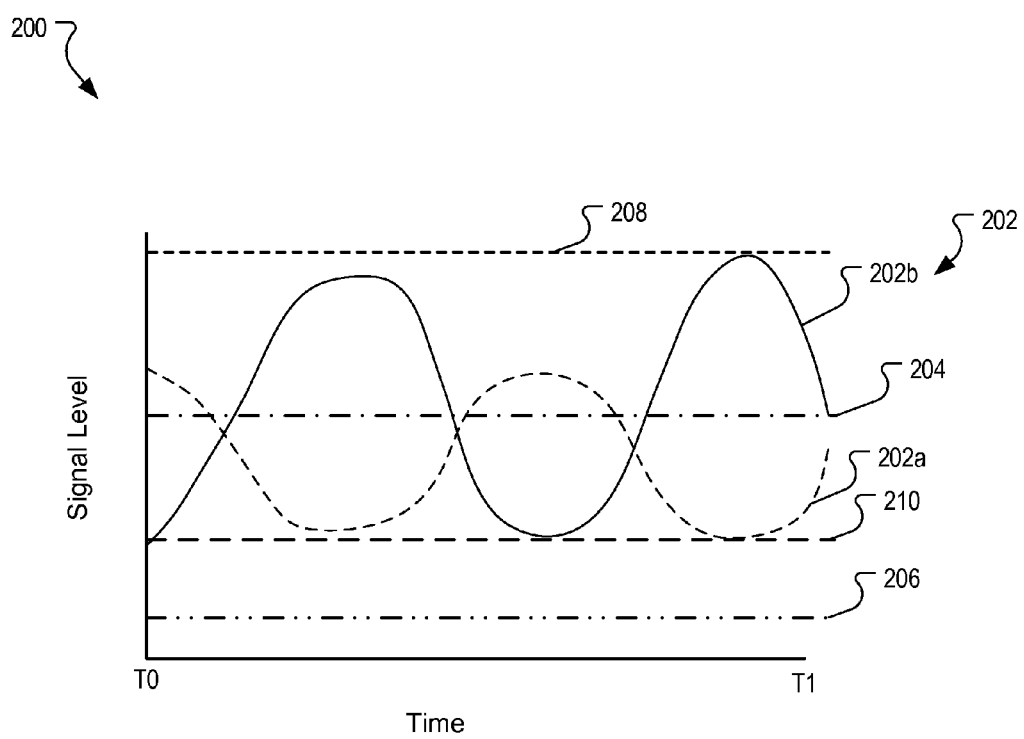
FIG. 2 is a graph of example signals that can be received by a receiver of a substation processing unit.

FIG. 2 is a graph 200 of example signals 202 that can be received by a receiver of a substation processing unit. The signals 202 that are received by the receiver include data that is being transmitted over many different channels. Each channel in the network can have unique channel characteristics, such that the signal being received corresponding to that channel can have unique signal characteristics relative to signals corresponding to other channels.

For example, a first channel may have a center frequency that corresponds to an RF frequency for which a signal (e.g., 202a) received over the first channel is attenuated relative to signals received over other channels in the system. Thus, the amplitude of the signal received over the first channel may be consistently lower than the amplitude of signals received over the other channels (e.g., 202b), even in a normal operating condition. Similarly, a noise floor for the first channel can vary relative to the noise floors of other channels.

Receiver gain adjustments that are made based on measured signal characteristics for the individual signals can be more precise than those made based on signal characteristics representing the total energy that is received at the receiver (e.g., based on the energy from all of the signals as a whole). For example, more precise trend data (e.g., amplitude increases or decreases over time) is revealed by considering the measured signal characteristics of each channel separately than that revealed by analyzing the signal characteristics of the signals together, because the trend for the individual channel is not obscured by energy that is contributed from other received signals. In turn, as described with reference to FIG. 3, the trend data can be considered when adjusting the receiver gain.

The signal characteristics for each of the signals 202a and 202b can be independently measured or detected, for example, by a receiver device, signal measurement equipment such as an oscilloscope, spectrum analyzer (swept or real-time), or another measurement device that is capable of measuring signal characteristics instantaneously or over time. The measured signal characteristics for each signal (e.g., 202a and 202b) can be stored in a data store, such as the channel data store 116 of FIG. 1. The measured signal characteristics for each channel can also be provided to a network monitoring system, such as the network management system 112 and/or status subsystem 114 of FIG. 1.

The signal characteristics for which values can be independently measured include a mean amplitude, a noise floor, a signal to noise ratio, a high amplitude (e.g., maximum amplitude), and a low amplitude (e.g., minimum amplitude). Other signal characteristics can also be measured (e.g., peak to peak amplitude, root mean squared amplitude, and duty cycle). The signal characteristic value that are independently measured for the received signals can be used to more precisely adjust receiver characteristics than adjustments that are made based on measurements of the total energy being received across all the channels.

The mean amplitude for each signal can be measured and/or computed as a mean value of the amplitude over a specified time. The specified time can be the entire time over which the amplitude of the signal has been measured or a delineation of the entire time (e.g., the last hour, day, or month). For example, the mean amplitude of the signal 202b can be represented by the line 204. In some implementations, an aggregate mean amplitude can also be computed that represents, for example, a mean of the mean amplitudes for each channel. Other statistical measures of the mean amplitudes for each of the signals can also be used (e.g., a median or a standard deviation value). Further, the aggregate mean amplitude can be a vector of mean amplitudes for each of the received signals.

The noise floor value, as used throughout this document, is a measure of the signals from noise sources that are present on the channel over which a signal is received. The noise floor value corresponds to a minimum signal amplitude value at which signal characteristics of the signal received over that channel is readily discernable from interfering signals from noise sources. An aggregate noise floor can also be computed that represented, for example, a mean (or another statistical measure) of the noise floors measured on each of the channels. The aggregate noise floor can also be a vector of noise floors for each channel of the network.

The signal to noise ratio, as used throughout this document, is a measure of signal amplitude (e.g., mean amplitude) relative to the noise floor. The signal to noise ratio for the signal 202b is represented by the line 206. The signal to noise ratio can vary over time, for example, based on changes to the signal amplitude of the signal received over a channel and changes to the noise floor of the channel. For example, if the mean amplitude of the signal falls while the noise floor value remains substantially the same, the signal to noise ratio for the signal will fall. An aggregate signal to noise ratio can also be computed, for example, as a mean (or another statistical measure) of the signal to noise ratios for each of the signals that is received over the channels. The aggregate signal to noise ratio may also be a vector of signal to noise ratio values for each of the signals and corresponding channels.

The high amplitude is a measure of the high signal amplitude for a signal. The high amplitude can be, for example, a maximum amplitude that has been measured for the signal. For example, the line 208 can represent the high amplitude for the signal 202b because the line 210 is tangent to the maximum amplitude that has been measured for the signal 202b. The high amplitude can be the highest measured signal amplitude value for the aggregate signal that has been measured over a specified time (e.g., milliseconds, minutes, days, or years).

The high amplitude can be periodically updated when the signal amplitude exceeds a previous high amplitude for the signal. Additionally, the high amplitude can be periodically (e.g., hourly or monthly) reset to a default value (e.g., 0.00), and then updated as described above. Alternatively, the high amplitude can be reset to the default value in response to the signal amplitude of the signal being less than a threshold amplitude for at least a specified time.

An aggregate high amplitude for the signals can also be determined. The aggregate high amplitude is a measure of high amplitude the signals received over the channels as a whole. The aggregate high amplitude can be, for example, a mean (or maximum) high amplitude that has been measured for the signals being received over each of the channels. The aggregate high amplitude can also be a vector of high amplitude values for each of the received signals.

The low amplitude is a measure of the low signal amplitude for a signal. The low signal amplitude can be, for example, a minimum amplitude that has been measured for the signal. For example, the line 210 can represent the minimum signal amplitude value for the signal 202a because the line 210 is tangent to the minimum amplitude that has been measured for the signal 202a over times T0 to T1. Like the maximum amplitude, the minimum amplitude can be reset to a default value (e.g., 0.00) periodically and continue to be updated, or be reset to the default value when the amplitude for the signal is greater than a threshold amplitude for at least a specified time. An aggregate low amplitude can also be computed, for example, as a mean (or minimum) low amplitude that has been measured for the signals being received over each of the channels. The aggregate low amplitude can also be a vector of low amplitude values for each of the received signals.

An amplitude swing (e.g., peak-to-peak amplitude) is a measure of amplitude change for a signal over one or more cycles of the signal. The amplitude swing can be computed, for example, as a mathematical difference (or another function) of the high amplitude for the signal and the low amplitude for the signal. An aggregate amplitude swing can also be computed, for example, as a mean (or minimum or maximum) amplitude swing that has been measured for the signals being received over each of the channels. The aggregate amplitude swing can also be a vector of amplitude swings that have been measured for each of the received signals.

Although examples in this description refer to the highest and lowest amplitudes that have been measured for a signal, the high and low amplitudes can be amplitudes that are less than the maximum and minimum amplitudes. For example, the high and low amplitudes can respectively be a high and low amplitude that is a proportionate to the maximum and minimum amplitudes for the signal.

As described above, the signal characteristics for each signal being received over the channels can be provided to the receiver adjustment subsystem 120 and/or stored in the signal data store 116, of FIG. 1. In turn, the signal characteristics can be analyzed to determine whether receiver characteristics of a receiver receiving the signals should be adjusted. For example, amplitude swings that are lower than a threshold swing may not enable accurate recovery of data being transmitted over the signals. Therefore, if the amplitude swings for the signals being received over the channels is less than a threshold amplitude swing, the gain of the receiver can be increased to increase the reliability of data recovery over the channels. Additionally, the receiver gain for a receiver can be decreased when one or more high amplitudes (or the aggregate high amplitude) of the signals are greater than a high amplitude threshold.

Figure 3:
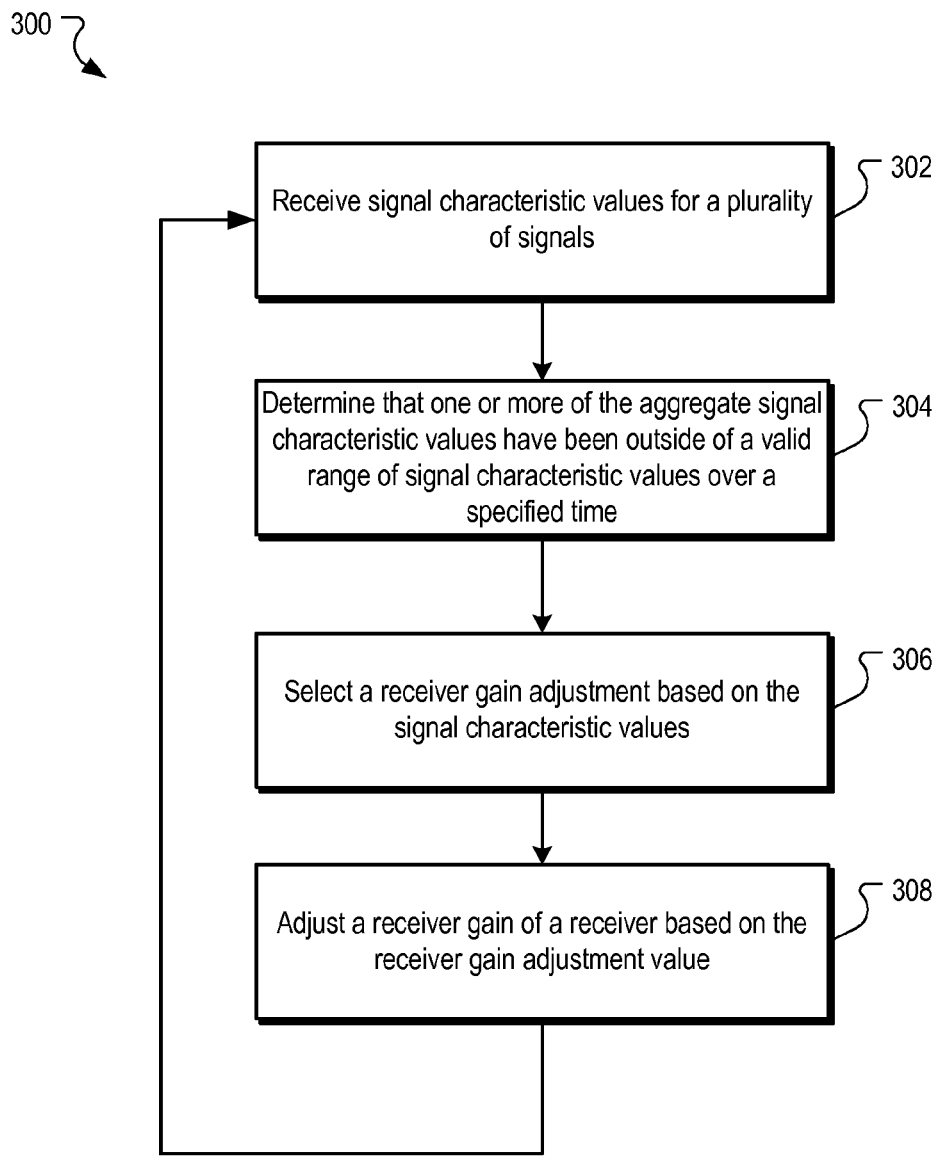
FIG. 3 is a flow chart of an example process for adjusting receiver characteristics of a receiver based on signal characteristics of an aggregate received signal.

FIG. 3 is a flow chart of an example process 300 for adjusting receiver characteristics of a receiver based on signal characteristics of an aggregate received signal. The process 300 is a process by which signal characteristic values for signals are received and used to determine whether the signal characteristic values have been outside of a valid range. Based on the determination, a receiver gain adjustment value is selected and a receiver gain is adjusted based on the receiver gain adjustment value.

The process 300 can be implemented, for example, by the receiver adjustment subsystem 120 and/or network management system 112 of FIG. 1. In some implementations, the receiver adjustment subsystem 120 includes one or more processors that are configured to perform actions of the process 300. In other implementations, a computer readable medium can include instructions that when executed by a computer cause the computer to perform actions of the process 300.

Signal characteristic values for a plurality of signals are received (302). In some implementations, the signal characteristics values received for each signal include one or more of a high signal amplitude, a low signal amplitude, an amplitude swing, and a signal to noise ratio for each signal. The signals for which the signal characteristic values are received can be limited to signals being received over active communications channels. An active communication channel is a channel that has been assigned to a communications node. For example, in an automatic meter reading network, an active channel can be a channel that has been assigned to an installed meter, and over which the installed meter communicates. In some implementations, the active communications channel can be defined as a channel over which valid data is being logged.

In some implementations, the signal characteristic values measured for each of the signals can be represented by aggregate signal characteristic values. For example, the aggregate signal characteristic values for the signals can include an aggregate mean amplitude, an aggregate high amplitude, an aggregate low amplitude, an aggregate amplitude swing, and an aggregate signal to noise ratio. Each of these aggregate signal characteristic values can be measured and/or computed, for example, based on the signal characteristic values that have been independently measured for each of the channels. In turn, the aggregate signal characteristic values can be received from the receiver, processing apparatus, or a data store storing the signal characteristic values.

As described above, each aggregate signal characteristic value can be computed as a mean, median, or another statistical measure (e.g., maximum or minimum) of the signal characteristic values for the signals being received over channels of the power line communications network. In some implementations, one or more of the aggregate signal characteristic values can be a vector of values, where each value in the vector represents a signal characteristic value for a signal being received over a corresponding channel. For example, the high amplitudes for signals being received over multiple channels can be used to generate a vector of high amplitude values, where each high amplitude value component of the vector represents the high amplitude for a signal being received over a corresponding channel. Additional vectors can be generated for each of the other signal characteristic values.

The reliability of aggregate signal characteristic values can be increased by preventing signals received over inactive channels from being included in the aggregate signal characteristic values. Inactive channels are those channels of the power line communications network that have not been assigned to an installed meter. Even though the inactive channels are not assigned to an installed meter, various signals can couple into the inactive channels and be received at the receiver. The energy from these various signals can represent energy from sources outside of the network. Thus, an aggregate signal characteristic that includes energy from inactive channels may not accurately represent the aggregate signal characteristics of signals being transmitted over active channels in the network. In turn, receiver gain adjustments that are made based, at least in part, on signals being received over inactive channels may lower the reliability of the data being received over the channels relative to the current reliability with which the data is being received.

Inactive and active channels can be identified as such in a channel index that includes a list of communications channels and data specifying whether the channel has been assigned to a node (e.g., meter) that is installed and operating in the network. The channel index can be, for example, a binary file that lists channels and serial numbers of meters that have been assigned each of the channels. If a channel has not yet been assigned, a default serial number identifying the channel as unassigned can be stored in a memory location corresponding to the channel.

A determination is made that one or more of the aggregate signal characteristic values have been outside of a valid range of signal characteristic values over a specified time (304). In some implementations, the valid range of signal characteristic values includes at least a high characteristic threshold and at least a low characteristic threshold. The high characteristic threshold can be, for example, a high amplitude threshold and/or a high mean amplitude threshold. Similarly, the low characteristic threshold can be, for example, a low amplitude threshold and/or a low mean amplitude threshold. As described in more detail below, the high and low amplitude thresholds can be maximum and minimum aggregate amplitudes for the signals and the high and low mean amplitudes can be a highest and lowest acceptable aggregate mean amplitudes for the signals. In some implementations, the determination that one or more of the aggregate signal characteristic values have been outside of a valid range of signal characteristic values over a specified time can be the result of a determination of whether the aggregate signal characteristic values have been outside of a valid range.

The high and low characteristic thresholds can be determined, for example, based on previously received or monitored signal characteristic values for the aggregate high and low amplitudes. For example, initial threshold values can be determined by monitoring signals received over the channels over a specified time and performing a statistical analysis of the signal characteristic values of the monitored signals. In turn, the threshold values can be selected as values at which the signal amplitude can be adjusted to ensure, with a specified statistical probability, that data can be reliably received over the channels.

Over time, statistical analysis of the aggregate signal characteristic values can be periodically performed to determine whether the characteristics of the signals have changed and, in turn, whether the valid range should be adjusted. The aggregate signal characteristic values may change, for example, because of changes in the environment in which the signals are transmitted (e.g., additional noise sources being introduced near the network) or based on additional elements (e.g., additional nodes or other network elements) being added to the network. For example, when additional nodes are assigned channels and begin to transmit data over the channels, the signal characteristics of the signals received by the receiver over these channels will contribute to the aggregate signal characteristic values, such that the aggregate signal characteristic values for the signals may change. In response to changes to the aggregate signal characteristic values, the valid range may need to be changed to ensure that data continues to be reliably received with the specified statistical probability.

In some implementations, the determination that the aggregate signal characteristic value is outside of the valid range can be based on determining that the aggregate high amplitude is higher than the high amplitude threshold and/or that the aggregate low amplitude is lower than the low amplitude threshold. For example, the aggregate high amplitude and the aggregate low amplitude for the signals can be continuously monitored and respectively compared to the high amplitude threshold and the low amplitude threshold. In turn, each time that either the aggregate high amplitude exceeds the high amplitude threshold or the aggregate low amplitude is less than the low amplitude threshold, the determination be made that the signal characteristics have been outside of a valid range.

When the aggregate high amplitude and/or low aggregate amplitude are vectors of high and low values for the signals being received over the channels, the determination that the aggregate signal characteristic is outside of the valid range can be based on a single value component of the vector violating the corresponding threshold. Alternatively, the determination can require that at least a threshold number or portion of the component value violate the threshold. For example, the determination that the aggregate high amplitude is outside of the valid range can be based on at least 10% of the component values of the vector being higher than the high amplitude threshold.

The determination that an aggregate signal characteristic value is outside of the valid range can also be conditioned on the aggregate signal characteristic value violating a corresponding threshold at least a threshold number of times over the specified period. For example, the threshold number of times can be set to zero such that any violation of the corresponding threshold will result in a determination that the characteristic value is outside of the valid range. Alternatively, the threshold number of times is set to be a value greater than zero, such that the aggregate signal characteristic values continue to be monitored until the threshold number of times is met or exceeded. Once the threshold number of times has been met or exceeded, the determination is made that the signal characteristic values have been outside of the valid range for at least the threshold number of times.

Requiring a corresponding threshold to be violated by more than one signal or more than once over a specified period can reduce the likelihood of determining that the aggregate signal characteristic value is outside of the valid range based on a non-recurring transient event. For example, when a voltage spike couples into a particular channel due to a non-recurring network event it may not be necessary to adjust the gain of the receiver because the aggregate signal characteristic values may automatically return to the valid range within moments of the voltage spike.

In response to the determination that the aggregate signal characteristic values have been outside of the valid range, a receiver gain adjustment value is selected based on the aggregate signal characteristic values (306). The receiver gain adjustment selection can be based for example, on a relative magnitude by which the aggregate signal characteristic values are outside of the valid range. For example, if the aggregate high amplitude is 10% higher than the high amplitude threshold, then the selected receiver gain adjustment value may be lower than that selected when the aggregate high amplitude is 75% higher than the high amplitude threshold.

The receiver gain adjustment value can represent an absolute gain value (e.g., +20 dBmV) to which the receiver gain is to be set, or a relative gain increase or decease (e.g., a 6 dB gain increase) over the current gain setting for the receiver. For example, in response to determining that the aggregate high amplitude is 100% higher than the high amplitude threshold, a receiver gain adjustment value representing a gain decrease of between 3-6 dB may be selected. The receiver gain adjustment value can also be expressed as an integer that represents a number of standard units of gain by which the gain should be changed. For example, each unit of gain may be 3 dB, such that a receiver gain adjustment value of −1 represents a −3 dB change in the receiver gain.

The receiver gain adjustments can be selected, for example, from an index of gain adjustment values. The gain adjustment values can be indexed according to the aggregate signal characteristic and/or combinations of aggregate signal characteristics that are outside of the valid range and/or a magnitude by which the signal characteristic values are outside of the valid range. For example, in response to determining that the high amplitude value is greater than the high amplitude threshold by 100%, the index of gain adjustment values can be accessed to identify a gain adjustment value that corresponds to a the high amplitude threshold being exceeded by 100%. In turn, the identified gain adjustment value can be selected.

In some implementations, the gain adjustment value selection can be refined by considering combinations of signal characteristics values and/or historical trend data for the signal characteristic values. For example, in response to determining that a valid amplitude range has been violated a determination can be made as to whether the high amplitude threshold or the low amplitude threshold were violated. When the high amplitude threshold is violated, the gain adjustment value that is selected in response to violation of the high amplitude threshold can be increased when a further determination is made that the aggregate mean amplitude of the signals also violates the mean high amplitude threshold and the aggregate signal amplitude and/or aggregate signal to noise ratio for the signals have decreased over a specified time.

For example, assume that aggregate high amplitudes, aggregate mean amplitudes, and aggregate signal to noise ratios have been logged for the signals over three sequential measurement periods (e.g., over 3 sequential hours). Table 1 provides example aggregate values for the signals over the three sequential measurement periods.

TABLE 1

| Measurement Period (Hour) | Aggregate High Amplitude (Mean High Amplitude) | Aggregate Mean Amplitudes (Mean Mean) | Aggregate Signal to Noise Ratios (Mean SNR) |
| --- | --- | --- | --- |
| 1 | 4.5 V | 2.0 V | 3 |
| 2 | 4.0 V | 1.5 V | 2 |
| 3 | 3.0 V | 1.0 V | 1.5 |

In this example, the aggregate high amplitudes have fallen from 4.5 Volts to 3.0 Volts from measurement period 1 to measurement period 3. Similarly, the aggregate mean amplitudes have fallen from 2.0 Volts to 1.0 Volts and the aggregate signal to noise ratio has fallen from 3 to 1.5 over the same period. Thus, the amplitudes are falling over time, such that a receiver gain adjustment value that may be selected based only on the aggregate high amplitude violating the high amplitude threshold can be adjusted to account for the falling amplitudes. For example, because the amplitudes are falling over time, the selected receiver gain adjustment value can be higher than the receiver gain adjustment value that would have been selected based on the violation of the high amplitude threshold alone.

In this example, selected receiver gain adjustment can also be higher than the receiver gain adjustment value that would have been selected based on the violation of the high amplitude threshold alone, because the signal to noise ratio has fallen over time. The signal to noise ratio can fall due to the signal amplitudes falling and/or an increase in the noise floor of the channels. Thus, the separation between the signals and the noise floor has fallen and a high receiver gain adjustment value can help maintain adequate separation between the signals and the noise floor.

In this example, the selected gain adjustment value that would have been selected based on the violation of the high amplitude threshold can also be increased when the aggregate amplitude swing (i.e., the mathematical difference between the high amplitude value and the low amplitude value) for the signals is less than a threshold swing. The determination that the amplitude swing is less than a threshold swing can be based on the aggregate high and low amplitudes of the signals.

The amount by which the gain adjustment value is increased relative to the gain adjustment value that would have been selected based on violation of the high amplitude threshold alone can be based, for example, on an amount by which the signal amplitudes and/or signal to noise ratios have decreased over the specified time. For example, the selected gain adjustment value can be higher when the amount by which the high signal amplitudes have decreased is higher than the gain adjustment value selected in response to lower decreases in the high signal amplitudes.

The selected gain adjustment value can be decreased relative to the gain adjustment value that would have been selected based on violation of the high amplitude threshold alone when the aggregate low amplitudes and/or the signal to noise ratios have decreased over time. The selected gain adjustment value can also be decreased when the low amplitude threshold is violated. Similarly, the selected gain adjustment value can be decreased when the low amplitude threshold is violated, the aggregate mean amplitude of the signals also violates the mean low amplitude threshold, and the aggregate low amplitude and/or aggregate signal to noise ratios have decreased over a specified time.

The amount by which the gain adjustment value is decreased can be based, for example, on an amount by which the low signal amplitudes and/or signal to noise ratios have decreased over the specified time. For example, the selected gain adjustment value can be higher when the amount by which the low signal amplitudes have decreased is higher than the gain adjustment value selected in response to lower decreases in the low signal amplitudes.

In some implementations, the amounts by which the selected gain adjustment values change in response to changes in signal amplitude values over time can be indexed based on statistical analysis of changes to the signal characteristics in response to changes to the receiver gain. For example, adjustments to the receiver gain in response to particular combinations of signal characteristic values can be logged along with the change to the signal characteristic values following the adjustment. These logged changes can be aggregated over time and statistically analyzed to determine gain adjustment values that are likely to result in increased data reliability, for example, when the gain adjustment values are selected in response to detecting a specific combination of signal characteristic values.

The receiver gain of a receiver is adjusted based on the receiver gain adjustment value (308). In some implementations, the receiver for which the receiver gain is adjusted is the receiver that receives the aggregate signal. In other implementations, the receiver for which the gain is adjusted can be a receiver that receives another aggregate signal having similar signal characteristics that are similar to the aggregate that was used to select the receiver gain adjustment value. The gain of the receiver is adjusted by an amount as specified by the gain adjustment value. For example, if the gain adjustment value provides an absolute gain value to which the receiver gain is to be set, the receiver gain can be adjusted until the absolute gain is achieved. If the gain adjustment value provides a relative gain increase (or decrease), the receiver gain can be increased (or decreased) by the amount specified by the gain adjustment value.

Once the gain of the receiver is adjusted, the process 300 can continue to be iteratively performed so that the aggregate signal continues to be within the valid range.

Figure 4:
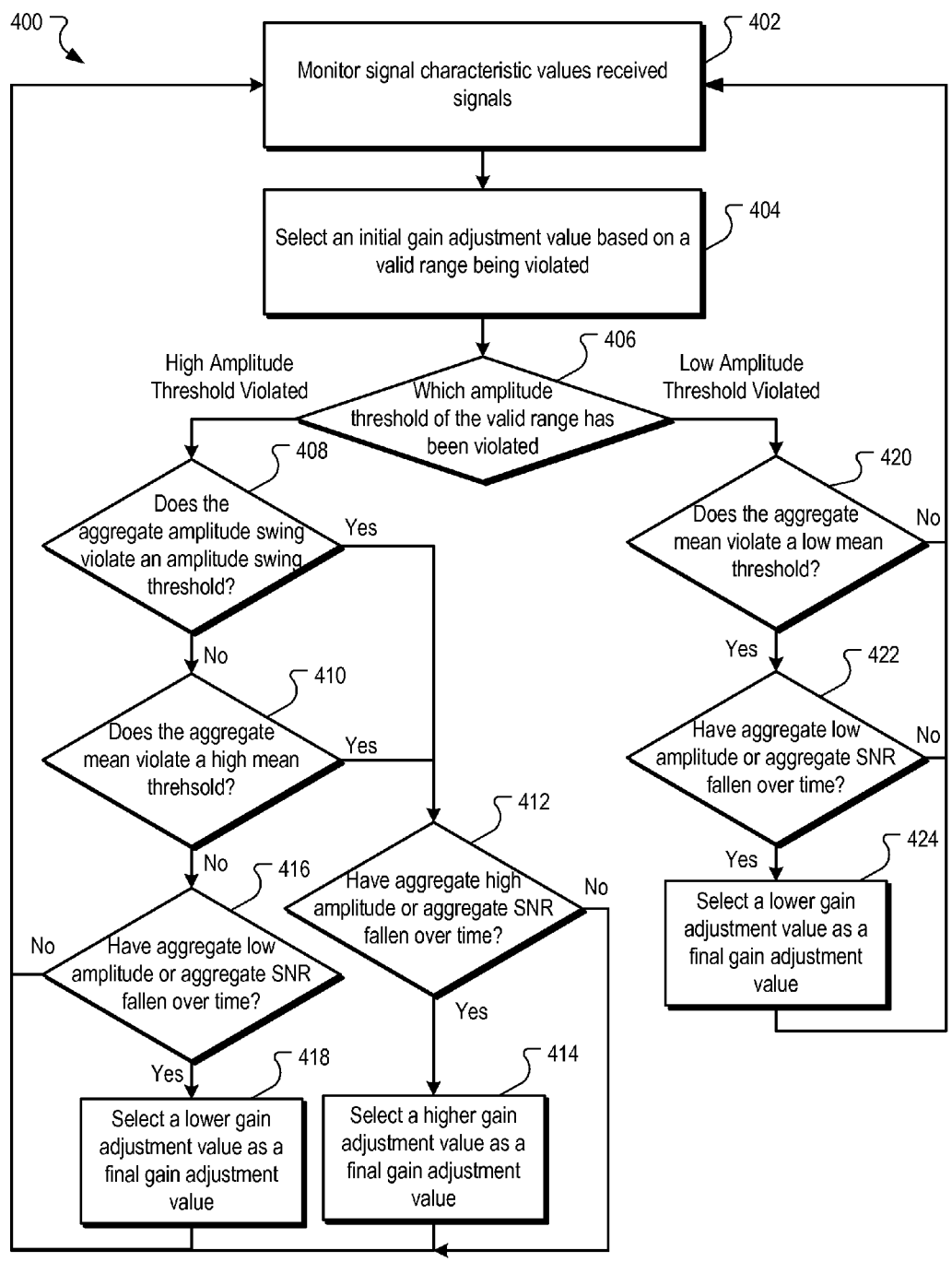
FIG. 4 is a flow chart of an example process for selecting a gain adjustment value.

FIG. 4 is a flow chart of an example process 400 for selecting a gain adjustment value. The process 400 is a process by which a determination is made that a high amplitude value or a low amplitude value has respectively violated a high amplitude threshold or a low amplitude threshold and an initial gain adjustment value is selected. In turn, other signal characteristic values are analyzed relative to corresponding thresholds and/or historical values for the signal characteristic values. Based on the analysis, a final gain adjustment value is selected and can be used to adjust the receiver gain of the receiver.

The process 400 can be implemented, for example, by the receiver adjustment subsystem 120 and/or network management system 112 of FIG. 1. In some implementations, the receiver adjustment subsystem 120 includes one or more processors that are configured to perform actions of the process 400. In other implementations, a computer readable medium can include instructions that when executed by a computer cause the computer to perform actions of the process 400.

Aggregate signal characteristic values for received signals are monitored (402). The aggregate signal characteristics can be monitored by measuring and/or computing the aggregate signal characteristics based on signals that are received over channels of a power line communication network. The aggregate signal characteristics can include, for example, an aggregate high amplitude, an aggregate low amplitude, an aggregate mean amplitude, and an aggregate signal to noise ratio. The aggregate signal characteristics can be monitored, for example, by a receiver receiving the signals and/or a data processing apparatus configured to measure and/or compute the aggregate signal characteristics.

An initial gain adjustment value is selected based on a valid range being violated (404). The initial gain can be selected, for example, as a standard gain increase or decrease that is selected when the valid range for the signal is violated. For example, the initial gain adjustment can be selected as a 6 dB adjustment to the current receiver gain in response to the valid range being violated. When the aggregate high or low amplitude exceeds a high amplitude threshold or a low amplitude threshold, the gain adjustment value can be a 6 dB reduction in the receiver gain.

A determination is made as to which amplitude threshold of the valid range has been violated (406). In some implementations, the valid range has a high amplitude threshold and a low amplitude threshold. When the aggregate high amplitude of the signals violates the high amplitude threshold (i.e., exceeds the high amplitude threshold), a determination is made as to whether the aggregate amplitude swing violates an amplitude swing threshold (408). For example, if the aggregate amplitude swing is greater than the amplitude swing threshold, the amplitude swing threshold is not violated. When the amplitude swing threshold is not violated, a determination is made as to whether the aggregate mean violates a high mean threshold (410).

When the aggregate mean violates the high mean threshold, or when the aggregate swing amplitude violates the amplitude swing threshold, a determination is made as to whether the aggregate high amplitude and/or the aggregate signal to noise ratio have decreased over time (412). When the aggregate high amplitude and/or signal to noise ratio have decreased over time, a gain adjustment value higher than the initial gain adjustment value is selected as a final gain adjustment value (414) and the signal characteristic values continue to be monitored (402). When the aggregate high amplitude and/or aggregate signal to noise ratio have not decreased over time, no adjustment is made and the signal characteristic values continue to be monitored (402).

Returning to (410), when the aggregate mean does not violate the high mean threshold, a determination is made as to whether the aggregate low amplitude and/or aggregate signal to noise ratio have fallen over time (416). When the aggregate low amplitude and/or aggregate signal to noise ratio have not fallen over time, the signal characteristic values continue to be monitored (402). When the aggregate low amplitude and/or aggregate signal to noise ratio have fallen over time, a final gain adjustment value that is lower than the initial gain adjustment value is selected (418) and the signal characteristics continue to be monitored (402).

Returning to (406), when it is determined that the low amplitude threshold of the valid range was violated a determination is made as to whether the aggregate mean violates a low mean threshold (420). When the aggregate mean does not violate the low mean threshold, the signal characteristic values continue to be monitored (402). When the aggregate mean does violate the low mean threshold, a determination is made as to whether the aggregate low amplitude and/or the aggregate signal to noise ratio have decreased over time (422).

When the aggregate low amplitude and/or aggregate signal to noise ratio have not decreased over time, the signal characteristics continue to be monitored (402). When the aggregate low amplitude an/or aggregate signal to noise ratio have decreased over time, the final gain adjustment value is selected to be higher than the initial gain adjustment value (424) and the signal characteristic values continue to be monitored (402).

In some implementations, the process 400 iteratively continues and after each iteration the receiver gain is adjusted using the final gain adjustment value that is selected. As described above, the final gain adjustment values that are selected in response to particular combinations of signal characteristic values be based on changes to the signal characteristic values resulting from the final gain adjustment values. For example, the signal characteristic values and final gain adjustment factors can be input to a machine learning algorithm that can generate a model that can be used to select gain adjustment values in response to the signal characteristic values that are being measured for the signals.

Figure 5:
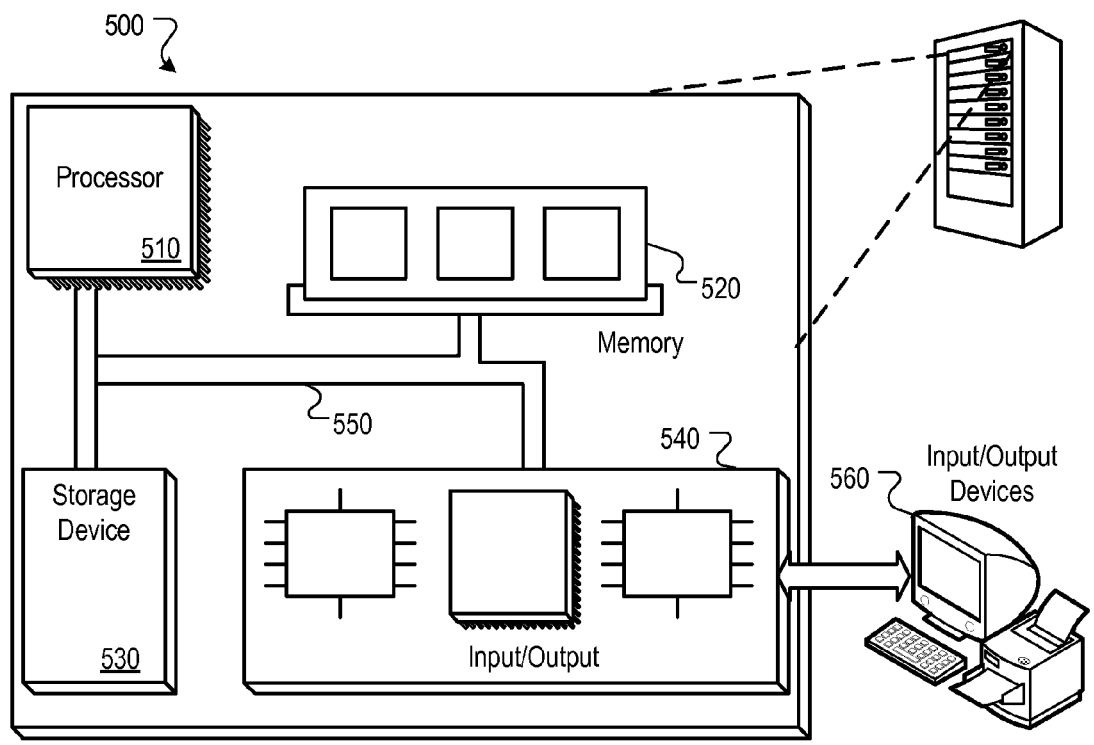
FIG. 5 is a block diagram of an example computer system that can be used to facilitate receiver gain adjustment.

FIG. 5 is a block diagram of an example computer system 500 that can be used to facilitate receiver gain adjustment. The system 500 includes a processor 510, a memory 520, a storage device 530, and an input/output device 540. Each of the components 510, 520, 530, and 540 can be interconnected, for example, using a system bus 550. The processor 510 is capable of processing instructions for execution within the system 500. In one implementation, the processor 510 is a single-threaded processor. In another implementation, the processor 510 is a multi-threaded processor. The processor 510 is capable of processing instructions stored in the memory 520 or on the storage device 530.

The memory 520 stores information within the system 500. In one implementation, the memory 520 is a computer-readable medium. In one implementation, the memory 520 is a volatile memory unit. In another implementation, the memory 520 is a non-volatile memory unit.

The storage device 530 is capable of providing mass storage for the system 500. In one implementation, the storage device 530 is a computer-readable medium. In various different implementations, the storage device 530 can include, for example, a hard disk device, an optical disk device, or some other large capacity storage device.

The input/output device 540 provides input/output operations for the system 500. In one implementation, the input/output device 540 can include one or more of a network interface device, e.g., an Ethernet card, a serial communication device, e.g., and RS-232 port, and/or a wireless interface device, e.g., and 802.11 card. In another implementation, the input/output device can include driver devices configured to receive input data and send output data to other input/output devices, e.g., keyboard, printer and display devices 560. Other implementations, however, can also be used, such as mobile computing devices, mobile communication devices, set-top box television client devices, etc.

Although an example processing system has been described in FIG. 5, implementations of the subject matter and the functional operations described in this specification can be implemented in other types of digital electronic circuitry, or in computer software, firmware, or hardware, including the structures disclosed in this specification and their structural equivalents, or in combinations of one or more of them.

Implementations of the subject matter and the operations described in this specification can be implemented in digital electronic circuitry, or in computer software, firmware, or hardware, including the structures disclosed in this specification and their structural equivalents, or in combinations of one or more of them.

Implementations of the subject matter described in this specification can be implemented as one or more computer programs, i.e., one or more modules of computer program instructions, encoded on computer storage medium for execution by, or to control the operation of, data processing apparatus. Alternatively or in addition, the program instructions can be encoded on an artificially-generated propagated signal, e.g., a machine-generated electrical, optical, or electromagnetic signal, that is generated to encode information for transmission to suitable receiver apparatus for execution by a data processing apparatus.

A computer storage medium can be, or be included in, a computer-readable storage device, a computer-readable storage substrate, a random or serial access memory array or device, or a combination of one or more of them. Moreover, while a computer storage medium is not a propagated signal, a computer storage medium can be a source or destination of computer program instructions encoded in an artificially-generated propagated signal. The computer storage medium can also be, or be included in, one or more separate physical components or media (e.g., multiple CDs, disks, or other storage devices).

The operations described in this specification can be implemented as operations performed by a data processing apparatus on data stored on one or more computer-readable storage devices or received from other sources.

The term "data processing apparatus" encompasses all kinds of apparatus, devices, and machines for processing data, including by way of example a programmable processor, a computer, a system on a chip, or multiple ones, or combinations, of the foregoing. The apparatus can include special purpose logic circuitry, e.g., an FPGA (field programmable gate array) or an ASIC (application-specific integrated circuit). The apparatus can also include, in addition to hardware, code that creates an execution environment for the computer program in question, e.g., code that constitutes processor firmware, a protocol stack, a database management system, an operating system, a cross-platform runtime environment, a virtual machine, or a combination of one or more of them. The apparatus and execution environment can realize various different computing model infrastructures, such as web services, distributed computing and grid computing infrastructures.

A computer program (also known as a program, software, software application, script, or code) can be written in any form of programming language, including compiled or interpreted languages, declarative or procedural languages, and it can be deployed in any form, including as a stand-alone program or as a module, component, subroutine, object, or other unit suitable for use in a computing environment. A computer program may, but need not, correspond to a file in a file system. A program can be stored in a portion of a file that holds other programs or data (e.g., one or more scripts stored in a markup language document), in a single file dedicated to the program in question, or in multiple coordinated files (e.g., files that store one or more modules, sub-programs, or portions of code). A computer program can be deployed to be executed on one computer or on multiple computers that are located at one site or distributed across multiple sites and interconnected by a communication network.

The processes and logic flows described in this specification can be performed by one or more programmable processors executing one or more computer programs to perform actions by operating on input data and generating output. The processes and logic flows can also be performed by, and apparatus can also be implemented as, special purpose logic circuitry, e.g., an FPGA (field programmable gate array) or an ASIC (application-specific integrated circuit).

Processors suitable for the execution of a computer program include, by way of example, both general and special purpose microprocessors, and any one or more processors of any kind of digital computer. Generally, a processor will receive instructions and data from a read-only memory or a random access memory or both. The essential elements of a computer are a processor for performing actions in accordance with instructions and one or more memory devices for storing instructions and data. Generally, a computer will also include, or be operatively coupled to receive data from or transfer data to, or both, one or more mass storage devices for storing data, e.g., magnetic, magneto-optical disks, or optical disks. However, a computer need not have such devices. Moreover, a computer can be embedded in another device, e.g., a mobile telephone, a personal digital assistant (PDA), a mobile audio or video player, a game console, a Global Positioning System (GPS) receiver, or a portable storage device (e.g., a universal serial bus (USB) flash drive), to name just a few. Devices suitable for storing computer program instructions and data include all forms of non-volatile memory, media and memory devices, including by way of example semiconductor memory devices, e.g., EPROM, EEPROM, and flash memory devices; magnetic disks, e.g., internal hard disks or removable disks; magneto-optical disks; and CD-ROM and DVD-ROM disks. The processor and the memory can be supplemented by, or incorporated in, special purpose logic circuitry.

To provide for interaction with a user, implementations of the subject matter described in this specification can be implemented on a computer having a display device, e.g., a CRT (cathode ray tube) or LCD (liquid crystal display) monitor, for displaying information to the user and a keyboard and a pointing device, e.g., a mouse or a trackball, by which the user can provide input to the computer. Other kinds of devices can be used to provide for interaction with a user as well; for example, feedback provided to the user can be any form of sensory feedback, e.g., visual feedback, auditory feedback, or tactile feedback; and input from the user can be received in any form, including acoustic, speech, or tactile input. In addition, a computer can interact with a user by sending documents to and receiving documents from a device that is used by the user; for example, by sending web pages to a web browser on a user's client device in response to requests received from the web browser.

Implementations of the subject matter described in this specification can be implemented in a computing system that includes a back-end component, e.g., as a data server, or that includes a middleware component, e.g., an application server, or that includes a front-end component, e.g., a client computer having a graphical user interface or a Web browser through which a user can interact with an implementation of the subject matter described in this specification, or any combination of one or more such back-end, middleware, or front-end components. The components of the system can be interconnected by any form or medium of digital data communication, e.g., a communication network. Examples of communication networks include a local area network ("LAN") and a wide area network ("WAN"), an inter-network (e.g., the Internet), and peer-to-peer networks (e.g., ad hoc peer-to-peer networks).

The computing system can include clients and servers. A client and server are generally remote from each other and typically interact through a communication network. The relationship of client and server arises by virtue of computer programs running on the respective computers and having a client-server relationship to each other. In some implementations, a server transmits data (e.g., an HTML page) to a client device (e.g., for purposes of displaying data to and receiving user input from a user interacting with the client device). Data generated at the client device (e.g., a result of the user interaction) can be received from the client device at the server.

While this specification contains many specific implementation details, these should not be construed as limitations on the scope of any inventions or of what may be claimed, but rather as descriptions of features specific to particular implementations of particular inventions. Certain features that are described in this specification in the context of separate implementations can also be implemented in combination in a single embodiment. Conversely, various features that are described in the context of a single embodiment can also be implemented in multiple implementations separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system components in the implementations described above should not be understood as requiring such separation in all implementations, and it should be understood that the described program components and systems can generally be integrated together in a single software product or packaged into multiple software products.

Thus, particular implementations of the subject matter have been described. Other implementations are within the scope of the following claims. In some cases, the actions recited in the claims can be performed in a different order and still achieve desirable results. In addition, the processes depicted in the accompanying figures do not necessarily require the particular order shown, or sequential order, to achieve desirable results. In certain implementations, multitasking and parallel processing may be advantageous.

What is claimed is:

1. A method, comprising:

receiving, by a data processing apparatus, aggregate signal characteristic values for a plurality of signals being received over active channels of a power line communications network in which power lines are used to distribute power to customers located in designated geographic areas and to provide data channels for communicating the aggregate signal characteristic values, the aggregate signal characteristic values being a function of the distributed power and being computed based on measured signal characteristic values for each of the signals being received over the active channels, the active communications channels being communications channels that have been assigned to communications nodes;

determining, by the data processing apparatus, that one or more of the aggregate signal characteristic values have been outside of a valid range of signal characteristic values over a specified period, the valid range of signal characteristic values specifying at least a high characteristic threshold and a low characteristic threshold;

in response to determining that the aggregate signal characteristic values have been outside of the valid range, selecting, by the data processing apparatus, a receiver gain adjustment value based on the aggregate signal characteristic values; and adjusting, by the data processing apparatus, a receiver gain of a receiver that receives the signals over the power line communications network based on the receiver gain adjustment value.

2. The method of claim 1, wherein selecting the receiver gain adjustment value comprises:

selecting an initial receiver gain adjustment value based on an aggregate high amplitude for the signals violating a high amplitude threshold;

determining that an aggregate mean amplitude violates a high mean threshold for the signals that specifies a highest acceptable aggregate mean amplitude for the signals;

determining that the aggregate high amplitude for the signals has decreased over a specified time;

determining that signal to noise ratios for the signals have decreased over the specified time; and in response to determining that the aggregate mean amplitude violates a high mean threshold, determining that the aggregate high amplitude for the signals has decreased, and determining that signal to noise ratios for the signals have decreased, selecting a final receiver gain adjustment value that is higher than the initial receiver gain adjustment value based on an amount by which the aggregate high amplitude and the signal to noise ratio have decreased over the specified time.

3. The method of claim 2, wherein determining that signal amplitude values of the signals have decreased:

computing an aggregate mean amplitude for active channels, each active channel being a channel over which a node in the network is communicating; and determining that the aggregate mean amplitude for the active channels is lower than at least one previously computed aggregate mean amplitude for the active channels.

4. The method of claim 1, wherein selecting the receiver gain adjustment value comprises:

selecting an initial receiver gain adjustment value based on an aggregate high amplitude for the signals violating a high amplitude threshold;

determining that an aggregate amplitude swing violates an amplitude swing threshold, the amplitude swing threshold specifying a minimum acceptable amplitude swing for signals received over active channels;

determining that at least one of the aggregate high amplitude and a signal to noise ratio for the signals has decreased over a specified time; and selecting a final receiver gain adjustment value that is higher than the initial receiver gain adjustment value.

5. The method of claim 4, wherein determining that at least one of the aggregate high amplitude and the signal to noise ratio has decreased over time comprises:

computing an aggregate high amplitude for the active channels, each active channel being a channel over which valid data is being received; and determining that the aggregate high amplitude for the active channels is lower than at least one previously computed, has decreased over time and is lower than at least one previously computed aggregate high amplitude for the active channels.

6. The method of claim 1, further comprising:
initializing aggregate signal characteristics values of a signal characteristic log to default values; and
storing aggregate signal characteristic values in the characteristic log, the stored values including an aggregate high amplitude and an aggregate low amplitude.

7. The method of claim 1, wherein determining that one or more of the aggregate signal characteristic values have been outside of a valid range of signal characteristic values comprises determining that an aggregate high amplitude for the signals has been higher than a high amplitude threshold.

8. The method of claim 7, wherein selecting a receiver gain adjustment value based on the aggregate signal characteristics comprises selecting an initial receiver gain adjustment value based on a magnitude by which the aggregate high amplitude exceeds the high amplitude threshold.

9. The method of claim 8, further comprising selecting a final receiver gain adjustment value that is higher than the initial receiver gain adjustment value when the aggregate high amplitude or a signal to noise ratio for the signals has decreased over a specified time.

10. The method of claim 1, wherein determining that one or more of the aggregate signal characteristic values have been outside of a valid range of signal characteristic values comprises determining that an aggregate low amplitude for the signals has been lower than a low amplitude threshold.

11. The method of claim 10, wherein selecting a receiver gain adjustment value based on the aggregate signal characteristics comprises selecting an initial receiver gain adjustment value based on a magnitude by which the aggregate low amplitude is less than the low amplitude threshold.

12. The method of claim 11, further comprising:
determining that an aggregate mean value for the signals violates a low mean threshold representing a lowest acceptable aggregate mean value for signals received over active channels, the active channels being channels over which nodes in the network are transmitting data;
determining that the aggregate low amplitude or an aggregate signal to noise ratio for the signals have decreased over time; and
in response to determining that an aggregate mean value for the signals violates a low mean threshold and determining that the aggregate low amplitude or an aggregate signal to noise ratio for the signals have decreased over time, selecting a final receiver gain adjustment value that is lower than the initial receiver gain adjustment value.

13. The method of claim 1, wherein receiving aggregate signal characteristic values comprises receiving a vector of values, where each value in the vector represents a signal characteristic value for a signal being received over a corresponding channel.

14. A system having a substation processing unit for facilitating distribution of power over power lines which, along with the substation processing unit, forms part of a power line distribution network, the system comprising:
a power line substation, including the substation processing unit;
the substation processing unit including a receiver and at least one processor, the substation processing unit being configured to receive signals over a plurality of active channels in a power line communications network and log signal characteristic values for the plurality of signals, the active channels being communications channels that have been assigned to communications nodes; and
a receiver adjustment subsystem coupled to the substation processing unit, the receiver adjustment subsystem including at least one processor and being configured to generate aggregate signal characteristic values for the plurality of signals, determine that one or more of the aggregate signal characteristics have been outside of a valid range of signal characteristic values, select, in response to the determination that the aggregate signal characteristics have been outside of the valid range, a receiver gain adjustment value based on the aggregate signal characteristics, and adjust a receiver gain for the receiver of the substation processing unit, the aggregate signal characteristic values being a function of the distributed power and being computed based on signal characteristic values for each of the signals being received over the active channels, and the valid range of signal characteristic values specifying at least a high characteristic threshold and a low characteristic threshold.

15. The system of claim 14, wherein the receiver adjustment subsystem is further configured to select an initial receiver gain adjustment value based on an aggregate high amplitude for the signals violating a high amplitude threshold, determine that an aggregate mean amplitude for the signals violates a high mean threshold that specifies a highest acceptable aggregate mean amplitude for the signals, determine that the aggregate high amplitude for the signals has decreased over a specified time and select a final receiver gain adjustment value that is higher than the initial receiver gain adjustment value based on an amount by which the aggregate high amplitude and a signal to noise ratio have decreased over the specified time.

16. The system of claim 14, wherein the receiver adjustment subsystem is further configured to select an initial receiver gain adjustment value based on an aggregate high amplitude for the signals violating a high amplitude threshold, determine that an aggregate amplitude swing violates an amplitude swing threshold, the amplitude swing threshold specifying a minimum acceptable amplitude swing for signals received over active channels, determine that at least one of the aggregate high amplitude and a signal to noise ratio for the signals has decreased over a specified time; and select a final receiver gain adjustment value that is higher than the initial receiver gain adjustment value.

17. The system of claim 14, wherein the receiver adjustment subsystem is further configured to determine that an aggregate high amplitude for the signals has been higher than a high amplitude threshold.

18. The system of claim 17, wherein the receiver adjustment subsystem is further configured to select an initial receiver gain adjustment value based on a magnitude by which the aggregate high amplitude exceeds the high amplitude threshold.

19. The system of claim 18, wherein the receiver adjustment subsystem is further configured to select a final receiver gain adjustment value that is higher than the initial receiver gain adjustment value when the aggregate high amplitude or a signal to noise ratio for the signals has decreased over a specified time.

20. The system of claim 14, wherein the receiver adjustment subsystem is further configured to determine that an aggregate low amplitude for the signals has been lower than a low amplitude threshold and select an initial receiver gain adjustment value based on a magnitude by which the aggregate low amplitude is less than the low amplitude threshold.

21. The system of claim 20, wherein the receiver adjustment subsystem is further configured to determine that an aggregate mean value for the signals violates a low mean threshold representing a lowest acceptable aggregate mean value for signals received over active channels, the active channels being channels over which nodes in the network are transmitting data, determine that the aggregate low amplitude or an aggregate signal to noise ratio for the signals have decreased over time, and select a final receiver gain adjustment value that is lower than the initial receiver gain adjustment value.

22. A non-transitory computer storage medium encoded with a computer program, the program comprising instructions that when executed by a data processing apparatus cause the data processing apparatus to perform operations comprising:

receiving, by a data processing apparatus, aggregate signal characteristic values for a plurality of signals being received over active channels of a power line communications network in which power lines are used to distribute power to customers located in designated geographic areas and to provide data channels for communicating the aggregate signal characteristic values, the aggregate signal characteristic values being a function of the distributed power and being computed based on signal characteristic values for each of the signals being received over the active channels, the active communications channels being communications channels that have been assigned to communications nodes;

determining, by a data processing apparatus, that one or more of the aggregate signal characteristic values have been outside of a valid range of signal characteristic values over a specified period, the valid range of signal characteristic values specifying at least a high characteristic threshold and a low characteristic threshold;

in response to determining that the aggregate signal characteristic values have been outside of the valid range, selecting, by a data processing apparatus, a receiver gain adjustment value based on the aggregate signal characteristics; and adjusting, by a data processing apparatus, a receiver gain of a receiver that receives the signals over the power line communications network based on the receiver gain adjustment value.

\* \* \* \* \*